United States Patent [19]

Isao et al.

[11] Patent Number: 5,938,897

[45] Date of Patent: *Aug. 17, 1999

[54] METHOD OF MANUFACTURING PHASE-SHIFTING PHOTOMASK BLANK

[75] Inventors: Akihiko Isao; Susumu Kawada; Yoshihiro Saito; Tsuneo Yamamoto; Atsushi Hayashi, all of Chichibu; Nobuyuki Yoshioka, Itami; Akira Chiba, Itami; Junji Miyazaki, Itami, all of Japan

[73] Assignees: Ulcoat (Ulvac Coating Corporation), Saitama; Mitsubishi Electric Corporation, Tokyo, both of Japan

[*] Notice: This patent is subject to a terminal disclaimer.

[21] Appl. No.: 08/876,906

[22] Filed: Jun. 16, 1997

Related U.S. Application Data

[60] Division of application No. 08/633,338, Apr. 17, 1996, which is a continuation-in-part of application No. 08/515,165, Aug. 15, 1995, Pat. No. 5,605,776.

[30] Foreign Application Priority Data

Sep. 8, 1994 [JP] Japan ................................. 6-214792

[51] Int. Cl.$^6$ ............................. C23C 14/14; C23C 14/34
[52] U.S. Cl. .............................. 204/192.15; 204/192.22; 204/192.23; 204/192.26; 430/5
[58] Field of Search ......................... 204/192.15, 192.22, 204/192.23, 192.26, 298.13; 430/5

[56] References Cited

U.S. PATENT DOCUMENTS 5,419,988  5/1995  Mohri et al. ................................ 430/5
5,605,776  2/1997  Isao et al. ................................... 430/5
5,635,315  6/1997  Mitsui ......................................... 430/5
5,804,337  9/1998  Mitsui ......................................... 430/5

FOREIGN PATENT DOCUMENTS 6-332152  12/1994  Japan .

OTHER PUBLICATIONS

Proceedings Reprint, SPIE vol. 2322 Photomask Technology and Management (1994), pp. 387–391. (no month).

Digest of Papers, Photomask Japan '95 and Symposium on Photomask and X–ray Mask Technology, Apr. 1995, pp. 94–95.

Photomask and X–Ray Mask Technology II, SPIE, vol. 2512 (1995), pp. 319–332. (no month).

Primary Examiner—Timothy Meeks
Attorney, Agent, or Firm—Arrmstrong, Westerman, Hattori, McLeland & Naughton

[57] ABSTRACT

A phase-shifting photomask blank is made by sputtering a target of molybdenum silicide with a sputtering gas to which nitric monoxide is added in a ratio of 2.65–6.47% by volume. A nitrided-oxide film of molybdenum silicide as a phase-shifting film is formed on a transparent substrate. A base phase-shifting film may be formed on a transparent substrate and then a nitrided-oxide film of molybdenum silicide as a surface layer may be formed on top of the base phase-shifting film by sputtering a target of molybdenum silicide with a sputtering gas to which nitric monoxide is added in a ratio of 0.59–6.47% by volume. The transparent substrate on which the nitrided-oxide film of molybdenum slicide is formed may be subjected to a heat treatment at a temperature of 200° C. or more.

4 Claims, 10 Drawing Sheets

ELECTRIC FIELD ON PHOTOMASK

OPTICAL INTENSITY ON WAFER

METHOD OF MANUFACTURING PHASE-SHIFTING PHOTOMASK BLANK

This is a divisional of application Ser. No. 08/633,338, filed Apr. 17, 1996, which is a continuation-in-part of application Ser. No. 08/515,165, filed Aug. 15, 1995, now U.S. Pat. No. 5,605,776.

BACKGROUND OF THE INVENTION

1. Field of the Invention

The present invention relates, in general, to a phase-shifting photomask blank and a method of manufacturing the same as well as a phase-shifting photomask. It relates, in particular, to an attenuation type of phase-shifting photomask blank in which the light of exposure wavelength is attenuated and which is particularly suitable to an exposure by an ultraviolet light such as KrF excimer laser or the like, and a method of manufacturing the same as well as a phase-shifting photomask.

2. Description of the Related Art

Figure 18A:
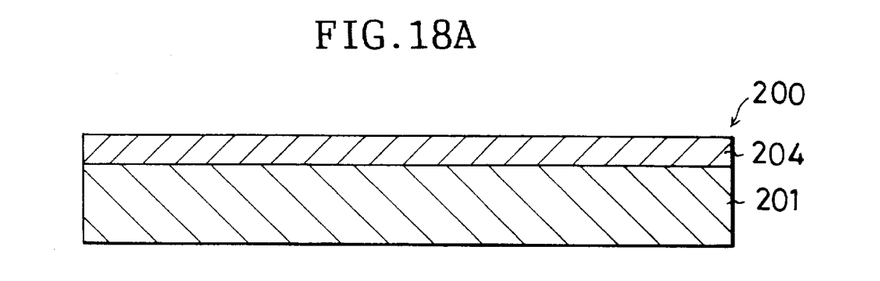
FIG. 18A is a phase-shifting photomask blank.
Figure 18B:
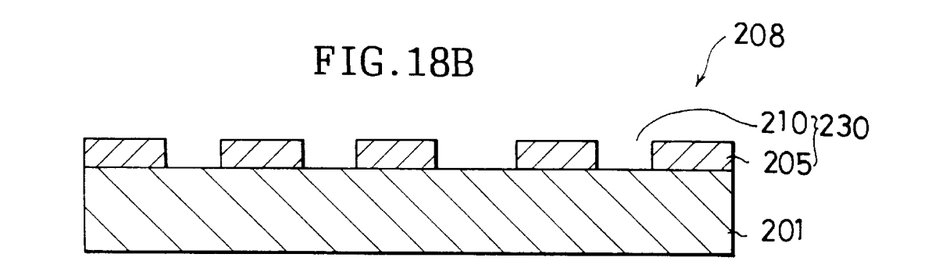
FIG. 18B is a phase-shifting photomask and FIG. 18C is a schematic diagram showing the optical intensity of exposure light on a wafer.

In a phase-shifting photomask 208 as shown in FIG. 18B there is formed a circuit pattern, i.e., a phase-shifting pattern 230 which is to be transferred to a semiconductor substrate, in the following manner. Namely, a desired portion of a phase-shifting film 204 on the surface of a phase-shifting photomask blank 200 shown in FIG. 18A is etched. An opening portion 210 in which the surface of a quartz substrate 201 is exposed and a phase-shifting portion 205 made up of a phase-shifting film that has been left unetched constitute the circuit pattern to be transferred to the semiconductor substrate.

Figure 18C:
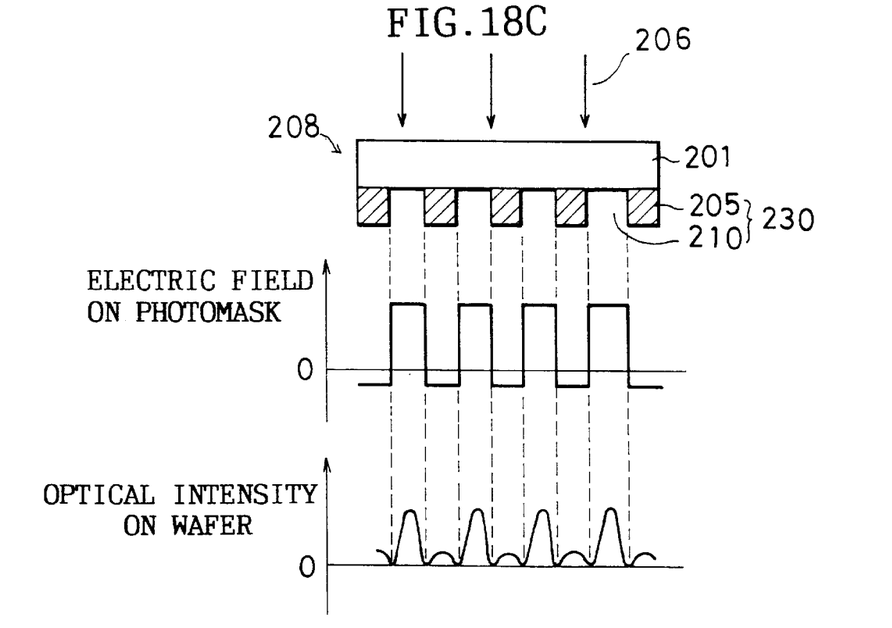

This phase-shifting portion 205 has a translucency at a wavelength of the exposure light. The thickness of this phase-shifting portion 205 is arranged such that the phase between the exposure light 206 penetrating the above-described opening portion 210 and the exposure light penetrating the above-described phase-shifting portion 205 differs by 180° (degrees). Therefore, when a wafer as shown in FIG. 18C is exposed, the optical intensity on the wafer in the border between the opening portion 210 and the phase-shifting portion 205 becomes zero. As a consequence, the circuit pattern transferred by the phase-shifting photomask has a high resolution.

As the above-described phase-shifting film 204 a single-layer film and a multi-layer film are normally used. The transmittance of the exposure light in the phase-shifting portion 205 is required to be normally about 3–40% in order to obtain an adequate amount of exposure light in lithography as well as to adjust the resist film thickness after developing of a resist film coated on the wafer.

However, in case the phase-shifting film 204 is constituted or made by the multi-layer film according to the prior art, there is a disadvantage in that the transmittance of the exposure light of short wavelength is low. In case KrF excimer laser (wavelength: 248 nm) is used as the exposure light to improve the resolution, there is a disadvantage in that a sufficient exposure cannot be made in the phase-shifting photomask made up of multiple layers.

On the other hand, in case the phase-shifting film is constituted by a single-layer film, the following method is conventionally used. Namely, a target of molybdenum silicide is sputtered in an atmosphere consisting of argon and oxygen, argon, oxygen and nitrogen, or argon and nitrous oxide (Ar: 84–72%, $N_2O$:16–28%) (see Japanese Published Unexamined Patent Application No. 332152/1994) to thereby form a thin film of an oxide or a nitrided oxide (or an oxynitride) of molybdenum silicide on the quartz substrate 201. This method, however, has a disadvantage in that, though the light transmittance is high, the resistance to attack by chemical agents (chemical durability) of the product is poor.

Furthermore, in case the single-layer film is an oxide film, the internal stress in the film is large. Therefore, there is a disadvantage in that the film is peeled off from the substrate or that the substrate is deformed.

Still furthermore, the single-layer film of the oxide or nitrided-oxide of molybdenum silicide exceeds about 50% in transmittance at a wavelength (e.g., $\lambda$=488 nm) to be normally used in defect inspection of photomasks. Therefore, there is a serious disadvantage in that the defect inspection is difficult.

SUMMARY OF THE INVENTION

The present invention has an object of solving the above-described disadvantages which are accompanied by the conventional phase-shifting photomasks. It provides a phase-shifting photomask blank in which the transmittance of the short-wave exposure light at KrF excimer laser exposure lightwave or the like is high (normally about 3%–40%), in which the transmittance at an inspection wavelength is low (normally below 50%, preferably below about 45%), in which the chemical durability is high, and in which the internal stress of the film is low. It also provides a method of manufacturing the above-described phase-shifting photomask blank, as well as a phase-shifting photomask.

According to the present invention, the foregoing and other objects are attained by a method of manufacturing a phase-shifting photomask blank comprising the step of sputtering a target of molybdenum silicide with a sputtering gas to which nitric monoxide is added in a ratio of 2.65–6.47% by volume, thereby forming a nitrided-oxide film of molybdenum silicide as a phase-shifting film on a transparent substrate.

In accordance with another aspect of the present invention, a method of manufacturing a phase-shifting photomask blank comprises the steps of: forming a base phase-shifting film on a transparent substrate; and thereafter sputtering a target of molybdenum silicide with a sputtering gas to which nitric monoxide is added in a ratio of 0.59–6.47% by volume, thereby forming a nitrided-oxide film of molybdenum silicide as a surface layer on top of the base phase-shifting film.

In accordance with another aspect of the present invention, the transparent substrate on which the nitrided-oxide film of molybdenum silicide is formed is subjected to a heat treatment at a temperature of 200° C., preferably at 250–350° C.

In accordance with still another aspect of the present invention, a phase-shifting photomask blank comprises: a transparent substrate; a nitrided-oxide film of molybdenum silicide as a phase-shifting film formed on the transparent substrate by sputtering a target of molybdenum silicide with a sputtering gas to which nitric monoxide is added in a ratio of 2.65–6.47% by volume.

In accordance with still another aspect of the present invention, a phase-shifting photomask blank comprises: a transparent substrate; a base phase-shifting film formed on the transparent substrate; and a surface layer of a nitrided-oxide film of molybdenum silicide formed on the phase-shifting film by sputtering a target of molybdenum silicide with a sputtering gas to which nitric monoxide is added in a ratio of 0.59–6.47% by volume.

Among the nitrided-oxide films of molybdenum silicide, those in which films are formed on the transparent substrate by sputtering molybdenum silicide with a sputtering gas in which nitric monoxide is added to inert gases such as argon or the like in a ratio of 2.65–6.47% by volume, have a high transmittance at short wavelengths such as KrF excimer laser wavelength, i-line wavelength, g-line wavelength or the like and have a low transmittance at the wavelength (488 nm) of the inspection beam to be normally used in a defect inspection device. Therefore, a phase-shifting photomask blank can be constituted at least by a single layer of this nitrided-oxide molybdenum silicide film.

The nitrided-oxide molybdenum silicide films formed under the above-described conditions are superior in the chemical durability and are small in internal stress in the films. Therefore, in the process in which a pattern to be transferred to a wafer substrate is formed on the phase-shifting photomask blank, neither are the optical properties deteriorated nor are the films peeled off.

If the ratio of adding nitric monoxide is small, the chemical durability of the nitrided-oxide film of molybdenum silicide is further improved. Therefore, if a nitrided-oxide film of molybdenum silicide is formed on top of a base phase-shifting film with a sputtering gas obtained by adding nitric monoxide to the inert gas in a ratio of about 0.59–6.47% by volume, preferably about 0.59% and over but below 2.65% by volume, the nitrided-oxide film of molybdenum silicide can be used as a surface layer of the phase-shifting film.

If the substrate is subjected to a heat treatment at about 200° C. or more after the formation of the nitrided-oxide film of molybdenum silicide, the optical properties are improved and the fluctuation or change in the transmittance in the manufacturing process can be minimized.

If the temperature of the heat treatment is too low, no remarkable effects can be attained and if the temperature is too high, it is not desirable from a viewpoint of film quality. Therefore, it is preferable to perform the heat treatment at about 250° C.–about 350° C., most preferably in the region of about 350° C. in case of a construction made up of the base film and the surface layer film. The atmosphere for the heat treatment may be an atmosphere in which the quality of the nitrided-oxide film of molybdenum silicide is not impaired, such as a vacuum atmosphere, inert gas atmosphere, nitric monoxide atmosphere, an atmosphere made by adding one or both of oxygen and nitrogen to the atmosphere of an inert gas, or the like.

BRIEF DESCRIPTION OF THE DRAWINGS

The above and other objects and the attendant advantages of the present invention will become readily apparent by reference to the following detailed description when considered in conjunction with the accompanying drawings wherein.

DETAILED DESCRIPTION OF PREFERRED EMBODIMENTS

An explanation of the present invention will now be made with reference to the accompanying drawings. The present invention, however, is not limited to them.

As conditions for a phase-shifting film, it is required that the transmittance of the exposure light be within a range of about 3–40% and that the phase of the exposure light be converted substantially by 180°. Nitrided-oxide films (or oxynitride films) of molybdenum silicide were formed under various conditions using a DC magnetron sputtering apparatus 500 shown in FIG. 6. By the way, the phase-shifting amount shall preferably be 180°, but may be 160–200° for practical purposes.

Figure 6:
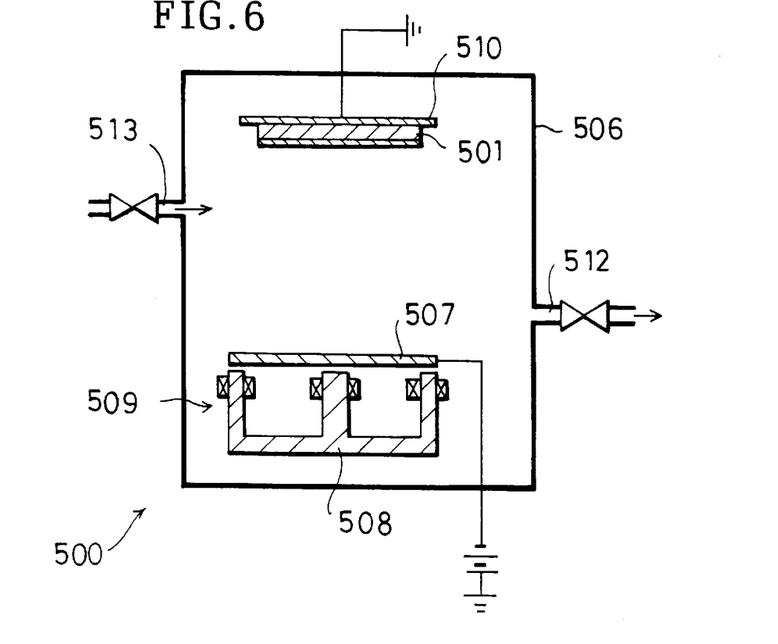
FIG. 6 is a schematic diagram showing the arrangement of a DC magnetron sputtering apparatus which can be used in the method of the present invention.

This DC magnetron sputtering apparatus 500 has a vacuum chamber 506, and is provided inside the vacuum chamber 506 with a magnetron cathode 509.

The magnetron cathode 509 comprises a target 507 made of a molybdenum silicide containing molybdenum (Mo) and silicon (Si) combined in a ratio of about 1:2, and a magnet 508. An anode 510 is oppositely disposed at a predetermined distance from the target 507. On that surface of the anode 510 which faces the target 507 there is disposed a square quartz substrate 501 of 2.3 mm in thickness and 127 mm in size in each side.

Inside the vacuum chamber 506 there are disposed an exhaust pipe 512 and a gas inlet pipe 513. The gas inlet pipe 513 is connected to a gas cylinder (not illustrated) so that argon (Ar) and nitric monoxide (NO) can be introduced into the vacuum chamber 506.

Gases obtained by adding nitric monoxide to argon in ratios as given in conditions M-1–M-24 in Table 1 were used as sputtering gases. Direct current voltage was applied to the target 507 to thereby sputter it. A plurality of separate quartz substrates corresponding to the conditions M-1–M-24 were prepared, and nitrided-oxide films of molybdenum silicide corresponding to the conditions M-1–M-24 were formed.

TABLE 1

| Condi-tions | Gas Flow Ratio (%) | | Gas Flow (SCCM) *1) | | Press. ($\times 10^{-3}$ Torr) | Deposition rate ($\text{Å}/\text{min}$) | Film Quality | Heating Conditions | | |
|---|---|---|---|---|---|---|---|---|---|---|
| | Ar | NO | Ar | NO | | | | Temp. °C. | Time hr | Atmos. Gass |
| M-1  | 99.41 | 0.59 | 169   | 1    | 3.7 | 542.6 | *2) | —   | — | —   |
| M-2  | 98.82 | 1.18 | 168   | 2    | 3.7 | 644   |     |     |   |     |
| M-3  | 98.24 | 1.76 | 167   | 3    | 2.8 | 707   |     |     |   |     |
| M-4  | 97.94 | 2.06 | 166.5 | 3.5  | 2.8 | 756   |     |     |   |     |
| M-5  | 97.65 | 2.35 | 166   | 4    | 2.8 | 752   |     |     |   |     |
| M-6  | 97.35 | 2.65 | 165.5 | 4.5  | 3.3 | 825   | *2) | —   | — | —   |
| M-7  | 95.59 | 4.41 | 162.5 | 7.5  | 3.6 | 814   |     |     |   |     |
| M-8  | 94.71 | 5.29 | 161   | 9    | 3.6 | 767   |     |     |   |     |
| M-9  | 94.12 | 5.88 | 160   | 10   | 3.6 | 728   |     |     |   |     |
| M-10 | 93.53 | 6.47 | 159   | 11   | 3.4 | 690   |     |     |   |     |
| M-11 | | | same as M-1  | | | | *2) | 250 | 1 | air |
| M-12 | | | same as M-2  | | | |     | 250 | 1 | air |
| M-13 | | | same as M-3  | | | |     | 250 | 1 | air |
| M-14 | | | same as M-4  | | | |     | 250 | 1 | air |
| M-15 | | | same as M-5  | | | |     | 250 | 1 | air |
| M-16 | | | same as M-6  | | | | *2) | 250 | 1 | air |
| M-17 | | | same as M-7  | | | |     | 250 | 1 | air |
| M-18 | | | same as M-8  | | | |     | 250 | 1 | air |
| M-19 | | | same as M-9  | | | |     | 250 | 1 | air |
| M-20 | | | same as M-10 | | | |     | 250 | 1 | air |
| M-21 | 98.24 | 1.76 | 167   | 3   | 2.8 | 756 | *2) | 350 | 3 | air |
| M-22 | 98.24 | 1.76 | 167   | 3   | 2.8 | 756 |     | 350 | 3 | Ar  |
| M-23 | 95.59 | 4.41 | 162.5 | 7.5 | 3.6 | 814 |     | 350 | 3 | air |
| M-24 | 95.59 | 4.41 | 162.5 | 7.5 | 3.6 | 814 |     | 350 | 3 | Ar  |

*1) Total of argon and nitric monoxide is 170 SCCM.
*2) Nitrided-oxide film of molybdenum silicide.

In each of the conditions M-1–M-24, the quartz substrates were heated (or baked) at the time of sputtering by a heating device and a temperature control device (both not illustrated) to maintain them to a temperature of 60–150° C.

Figure 1:
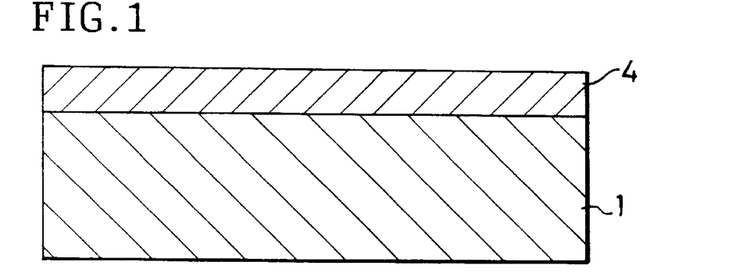
FIG. 1 is a sectional view of a nitrided-oxide film of molybdenum silicide formed by one example of the present invention.

Under any of the conditions M-1–M-24 nitrided-oxide films of molybdenum silicide 4 as shown in FIG. 1 were formed on the main surfaces of the quartz substrates 1.

The conditions M-11–M-24 contain further conditions in which the quartz substrates were taken out of the DC magnetron sputtering apparatus 500 after having formed the films and then were subjected to a heat treatment in a clean oven under conditions as given in Table 1. Conditions M-1–M-10 do not contain the heat treatment. The conditions M-21–M-24 were added to observe the changes in optical constants as a result of processing at a temperature of 350° C.

By using a spectrophotometer, measuring light beam of a wavelength of 248 nm corresponding to KrF laser beam and measuring light beam of a wavelength of 488 nm corresponding to inspection beam were caused to be vertically incident upon the samples on which the films were formed under the above-described conditions to measure the reflectance R and the transmittance T. From the measured results and the thicknesses of the nitrided-oxide films of molybdenum silicide, which were obtained separately by a stylus method, a refractive index n and an extinction coefficient k of an optical constant (n–i·k) were computed by RT method.

The values obtained with respect to the nitrided-oxide films of molybdenum silicide 4 formed under each of the conditions M-1–M-24 were averaged and are shown in Table 2.

TABLE 2

Optical Properties of Nitrided-oxide Films of
Molybdenum Silicide Formed under Conditions of M-1–M-24

| Conditions | KrF Laser (248 nm) | | | | Inspection Wavelength (488 nm) | | |
|---|---|---|---|---|---|---|---|
| | Transmittance (T %) | Optical Constant n | Optical Constant k | $d_s = \dfrac{2480}{2(n-1)}$ (Å) | Transmittance (T %) | Optical Constant n | Optical Constant k |
| M-1  | 0.000 | 1.465 | 1.751  | 2667 | 0.031 | 3.018 | 1.111 |
| M-2  | 0.518 | 2.336 | 1.068  | 928  | 9.07  | 2.686 | 0.8685 |
| M-3  | 0.761 | 2.221 | 0.9077 | 1016 | 13.03 | 2.512 | 0.6736 |
| M-4  | 1.73  | 2.251 | 0.7645 | 991  | 18.0  | 2.423 | 0.5811 |
| M-5  | 2.27  | 2.212 | 0.6898 | 1023 | 17.46 | 2.365 | 0.5784 |
| M-6  | 4.45  | 2.196 | 0.5535 | 1037 | 34.5  | 2.251 | 0.3369 |
| M-7  | 6.09  | 1.940 | 0.3958 | 1319 | 37.33 | 1.790 | 0.2612 |
| M-8  | 6.73  | 1.918 | 0.3723 | 1351 | 40.20 | 1.937 | 0.2233 |
| M-9  | 7.26  | 1.917 | 0.361  | 1352 | 42.67 | 1.930 | 0.2070 |
| M-10 | 7.76  | 1.915 | 0.3504 | 1355 | 45.4  | 1.928 | 0.1897 |
| M-11 | 0.992 | 2.949 | 1.296  | 636  | 10.37 | 2.990 | 1.142 |
| M-12 | 0.874 | 2.319 | 0.9454 | 940  | 10.49 | 2.598 | 0.8098 |
| M-13 | 1.892 | 2.248 | 0.7447 | 994  | 18.04 | 2.392 | 0.5823 |
| M-14 | 1.40  | 2.123 | 0.7299 | 1104 | 17.24 | 2.354 | 0.5348 |
| M-15 | 1.92  | 2.091 | 0.6558 | 1137 | 24.1  | 2.205 | 0.4226 |
| M-16 | 4.12  | 2.117 | 0.5337 | 1110 | 35.2  | 2.217 | 0.3068 |
| M-17 | 7.65  | 1.965 | 0.3687 | 1285 | 44.0  | 2.095 | 0.1985 |
| M-18 | 7.59  | 1.877 | 0.3398 | 1414 | 50.7  | 1.810 | 0.1576 |
| M-19 | 6.67  | 1.807 | 0.3520 | 1537 | 48.1  | 1.770 | 0.1560 |
| M-20 | 3.35  | 1.679 | 0.3564 | 1826 | 44.2  | 1.528 | 0.1554 |
| M-21 | 0.145 | 1.679 | 0.6995 | 1826 | 7.46  | 2.322 | 0.5008 |
| M-22 | 0.681 | 1.843 | 0.6543 | 1471 | 11.4  | 2.265 | 0.5020 |
| M-23 | 20.3  | 1.960 | 0.2208 | 1292 | 67.6  | 1.263 | 0.1050 |
| M-24 | 16.0  | 1.919 | 0.2463 | 1349 | 64.3  | 1.207 | 0.1151 |

Figure 7:
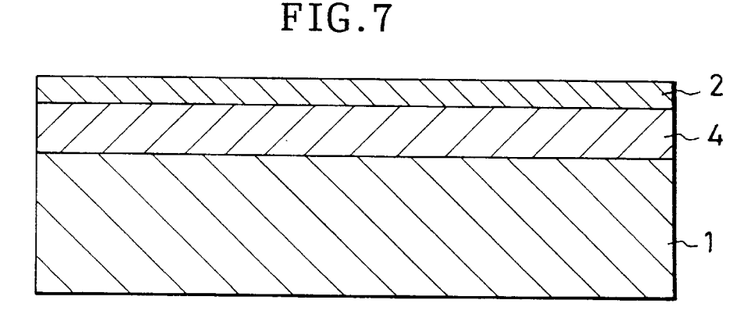
FIG. 7 is a diagram showing part of the processes of another example of the method according to the present invention.
Figure 8:
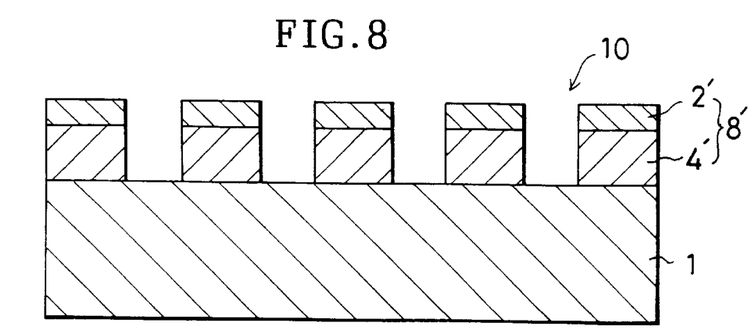
FIG. 8 is a diagram showing part of the processes of another example of the method according to the present invention.

An explanation will now be made about examples in each of which a film was formed as a surface layer (or a top coat or an overcoating) of a phase-shifting film with a sputtering gas containing a smaller amount of nitric monoxide. As shown in FIG. 7, a nitrided-oxide film of molybdenum silicide 4 formed on a transparent substrate 1 under conditions of M-6–M-8 was defined to be a first layer. On top of this first layer, a nitrided-oxide film of molybdenum silicide 2 was formed as a second layer under conditions of M-3 and M-5. The conditions for forming the multiple layer films are called M2-1–M2-4. Table 3 shows the correlation between the film forming conditions for the first layer and those for the second layer in these conditions M2-1–M2-4.

first layer of nitrided-oxide film of molybdenum silicide 4 and in which the heat treatment was performed only after the formation of the second layer of nitrided-oxide film of molybdenum silicide 2. The condition M2-4 is that the heat treatment was performed after the formation of the first layer of nitrided-oxide film of molybdenum silicide 4 before the formation of the second layer of nitrided-oxide film of molybdenum silicide 2, as well as after the formation of the second layer of nitrided-oxide film of molybdenum silicide 2.

By using a spectrophotometer, measuring light beam of a wavelength of 248 nm and inspection beam of a wavelength of 488 nm were caused to be vertically incident upon the

TABLE 3

Conditions M1-1 and M2-1–M2-4

| Conditions for Forming Multiple-layer Films | Conditions for Forming 2nd-layer Film | Conditions for Forming 1st layer Film | Heating Conditions after Forming 2nd-layer Film | | | Heating Condition after Forming 1st-layer Film | | |
|---|---|---|---|---|---|---|---|---|
| | | | Temp. °C. | Time hr | Atmos. Gass | Temp. °C. | Time hr | Atmos. Gas |
| M1-1 | No film formation | M-6 | 250 | 1 | air | No intermediate heat treatment | | |
| M2-1 | M-5 | M-8 | 250 | 1 | air | | | |
| M2-2 | M-3 | M-7 | 350 | 3 | air | | | |
| M2-3 | M-3 | M-7 | 350 | 3 | Ar  | | | |
| M2-4 | M-3 | M-7 | 250 | 1 | air | 350 | 3 | Ar |

The condition M1-1 in Table 3 is that of a single layer in which the second layer of nitrided-oxide film of molybdenum silicide is not formed.

Further, the conditions M2-1–M2-3 are those in which heat treatment was not performed after the formation of the samples on which the films were formed under the above-described conditions to measure the reflectance R and the transmittance T. From the measured results and the thicknesses of the nitrided-oxide films of molybdenum silicide, which were obtained separately by a stylus method, a refractive index n and an extinction coefficient k of an optical constant (n–i·k) were computed by RT method.

The values obtained with respect to the nitrided-oxide films of molybdenum silicide 4 formed under each of the conditions M1-1 and M2-1–M2-4 were averaged and are shown in Table 4.

film and the film thickness $d_2$ of the second-layer film were computed using the above formulas, and the time of film formation was obtained from each of the film thicknesses and the time of film formation, such that the phase angles as given in Table 4 can be obtained at the KrF excimer laser wavelength.

TABLE 4

Optical Properties of Nitrided-oxide Molybdenum Silicide Films Formed under Conditions M1-1 and M2-1–M2-4

| Conditions | Layer | Film Thickness of 2nd Layer $d_2$ (Å) | Film Thickness of 1st Layer $d_1$ (Å) | KrF Laser (wavelength: 248 nm) Transmittance (T %) | Phase Angle ($P_s$ deg.) | Inspection Wavelength (488 nm) Transmittance (T %) |
|---|---|---|---|---|---|---|
| M1-1 | 1 | — | 1048 | 4.88 | 170° | 37.4 |
| M2-1 | 2 | 302 | 1038 | 5.07 | 180° | 35.7 |
| M2-2 | 2 | 308 | 1083 | 5.48 | 175° | 30.4 |
| M2-3 | 2 | 270 | 1161 | 5.49 | 180° | 31.3 |
| M2-4 | 2 | 270 | 1150 | 8.29 | 180° | 31.7 |

The value $d_s$ given in Table 2 denotes a film thickness required to convert the phase of the transmitted light by 180°. The values $d_s$ listed therein are not actually measured values but were obtained by the following formula from the measured values of the refractive index n $$d_s = \lambda_0/2\,(n-1) \quad (1)$$

where $\lambda_0$ is the wavelength of the exposure light which penetrates the nitrided-oxide films of molybdenum silicide 4.

Further, in the case of two-layer film, the following approximate relationship can be established among a target phase angle $P_s$, the film thickness $d_1$ of the first-layer film and the film thickness $d_2$ of the second-layer film $$d_1 + d_2 = P_s/180° \cdot \lambda_0/\{(2 \cdot (n-1)\} \quad (2)$$

where $$n = (n_1 \cdot d_1 + n_2 \cdot d_2)/(d_1 + d_2) \quad (3)$$

and where $n_1$ is a refractive index of the first-layer film and $n_2$ is a refractive index of the second-layer film at a wavelength $\lambda_0$ of the exposure light.

The conditions M1-1 and M2-1–M2-4 are film forming conditions in which the film thickness $d_1$ of the first-layer The transmittance at the KrF excimer laser wavelength and the transmittance at the inspection wavelength through the nitrided-oxide films of molybdenum silicide formed under the conditions of M1-1 and M2-1–M2-4 were measured. The results of the measurements are given in Table 4 together with the film forming conditions.

The nitrided-oxide films of molybdenum silicide formed under the conditions of M1-1 are high in transmittance at the KrF excimer laser wavelength. The transmittance of the inspection wavelength (488 nm) is smaller than 50%. The above meet the optical properties required of the phase-shifting photomask. It follows that the nitrided-oxide films of molybdenum silicide formed under these conditions can be used in a single layer as a phase-shifting film.

Thereafter, tests were made of the chemical durability of the nitrided-oxide films of molybdenum silicide formed under each of the above conditions.

Samples on which the films were formed under conditions of M-16–M-19 were dipped or immersed into chemical agents under conditions shown in Table 5. Changes in transmittance T were measured and the chemical durabilities were evaluated. The results of their measurements are given in FIGS. 9–16.

TABLE 5

Chemical Durability

| Conditions | NO Gas Flow Amount (SCCM) *1) | Testing Conditions Immersing Liquid | Temp. (° C.) | Time (hr) | Change in Transmittance in Each Wavelength |  |  |
|---|---|---|---|---|---|---|---|
|  |  |  |  |  | Wavelength 248 nm (%) | 365 nm (%) | 488 nm (%) |
| M-16~ M-19 | 4.5~9 | 0.5 wt % ammonium water | room temp. | 1 | FIG. 10 | FIG. 9 |  |
| M-16~ M-19 | 4.5~9 | concentrated sulfuric acid | 100 | 1 | FIG. 12 | FIG. 11 |  |
| M-16~ M-19 | 4.5~9 | mixture of concentrated sulfuric acid and hydrogen | 100 | 0.5 | FIG. 14 | FIG. 13 |  |

TABLE 5-continued

Chemical Durability

| Conditions | NO Gas Flow Amount (SCCM) *1) | Testing Conditions Immersing Liquid | Temp. (° C.) | Time (hr) | Change in Transmittance in Each Wavelength |  |  |
|---|---|---|---|---|---|---|---|
| | | | | | Wave- 248 nm (%) | 365 nm (%) | 488 nm (%) |
| M-16~ M-19 | 4.5~9 | peroxide mixture of concentrated sulfuric acid and nitric acid | 100 | 0.5 | FIG. 16 | FIG. 15 | |
| M-5 | 4 | concentrated sulfuric acid | 100 | 1 | 0.5 | 0.4 | |
| M-15 | 4 | | | | 0 | 0.2 | |
| M-8 | 9 | | | | 1.5 | 1.2 | |
| M-18 | 9 | | | | 0.8 | 0.3 | |
| M2-2 | 7.5 (1st layer) 3 (2nd layer) | | | | 0.1 | 0.2 | |
| M2-3 | 7.5 (1st layer) 3 (2nd layer) | | | | 0.1 | 0.1 | |

*1) Total of argon and nitric monoxide is 170 SCCM.

For the purpose of comparison, there are also given changes in transmittance of examples in which nitrided-oxide films of molybdenum silicide were formed on quartz substrates by sputtering a molybdenum silicide target by adding oxygen ($O_2$) to argon, followed by a heat treatment at 250° C. for 1 hour.

Figure 9:
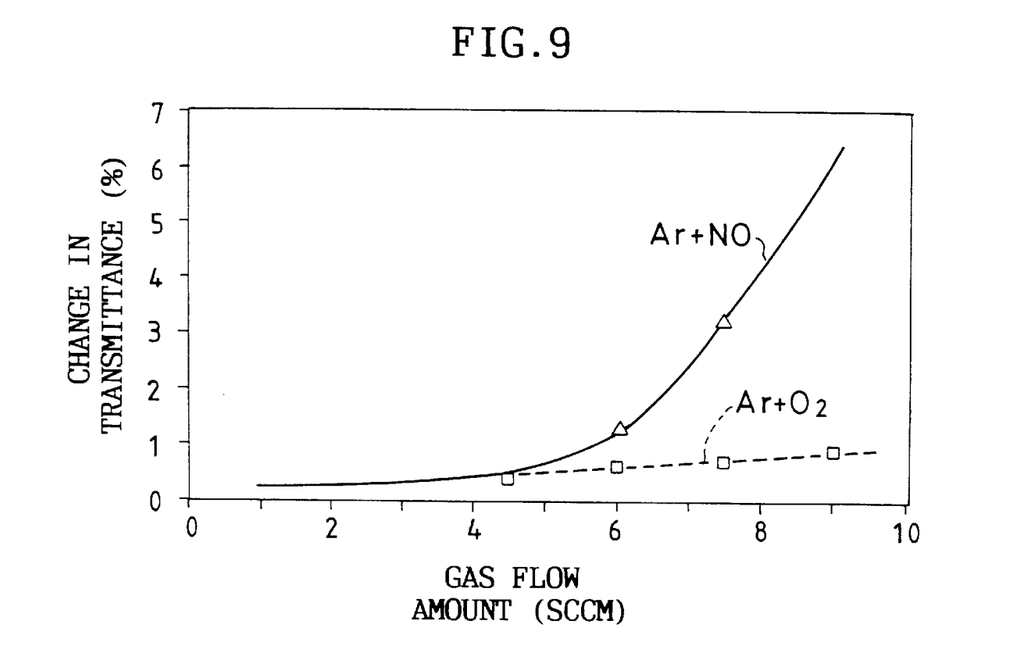
FIG. 9 is a graph showing the resistance (or durability) to an aqueous solution of ammonia of a phase-shifting photomask manufactured by the method of the present invention as represented in the change in transmittance at an i-line wavelength.
Figure 10:
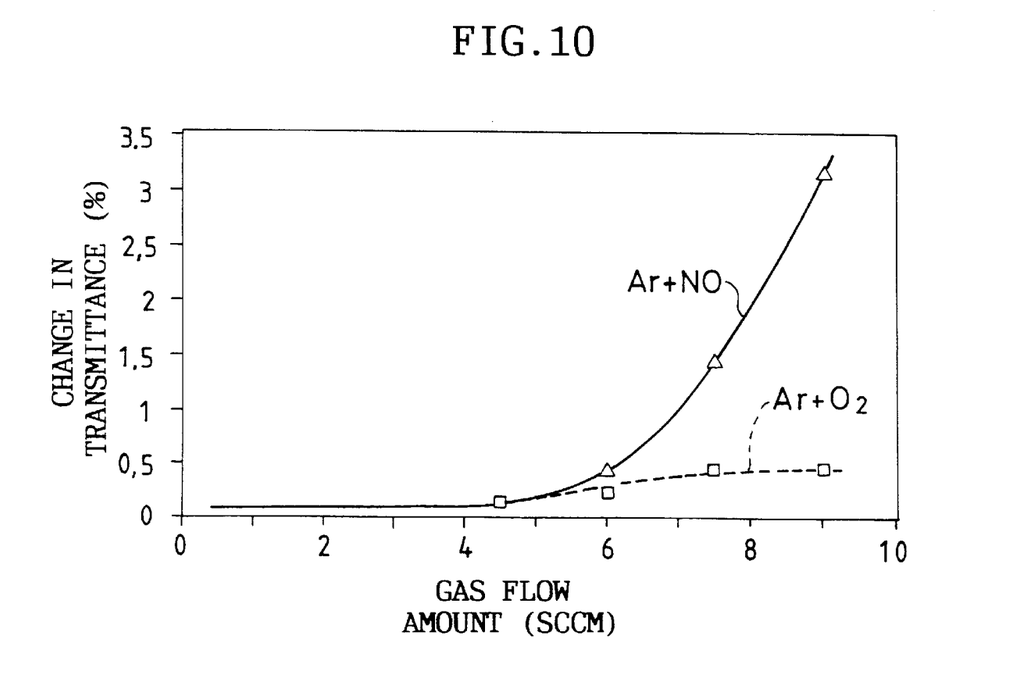
FIG. 10 is a graph showing the resistance to an aqueous solution of ammonia of a phase-shifting photomask manufactured by the method of the present invention as represented in the change in transmittance at a KrF excimer laser wavelength.
Figure 11:
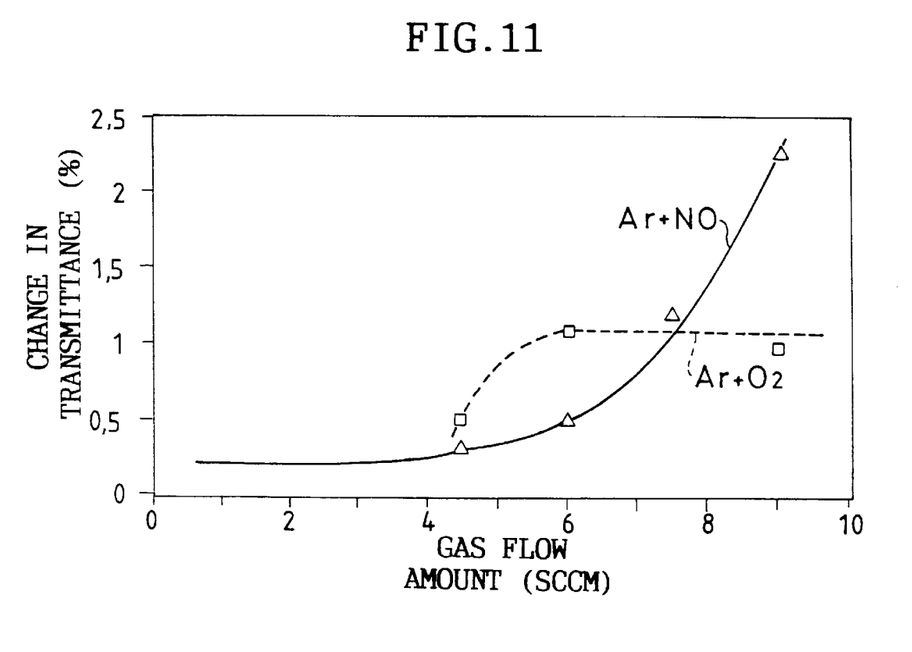
FIG. 11 is a graph showing the resistance to a concentrated sulfuric acid of a phase-shifting photomask manufactured by the method of the present invention as represented in the change in transmittance at an i-line wavelength.
Figure 12:
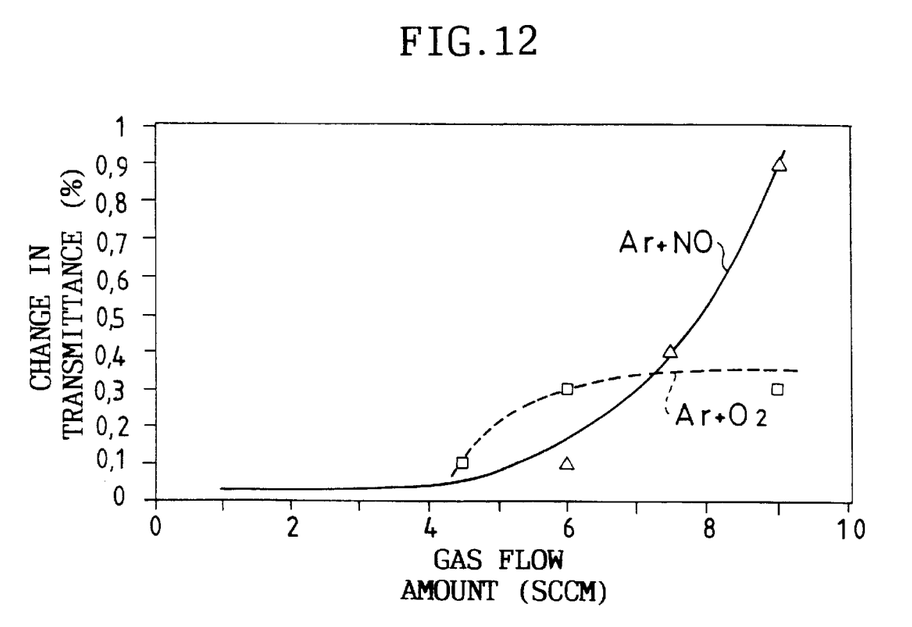
FIG. 12 is a graph showing the resistance to a concentrated sulfuric acid of a phase-shifting photomask manufactured by the method of the present invention as represented in the change in transmittance at a KrF excimer laser wavelength.
Figure 13:
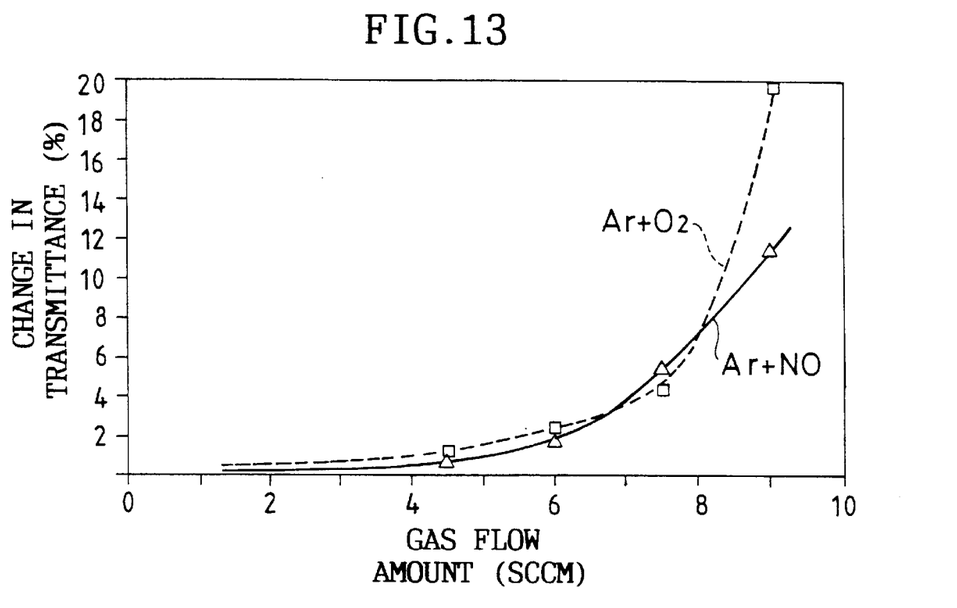
FIG. 13 is a graph showing the resistance, to a mixture of a concentrated sulfuric acid and hydrogen peroxide, of a phase-shifting photomask manufactured by the method of the present invention as represented in the change in transmittance at an i-line wavelength.
Figure 14:
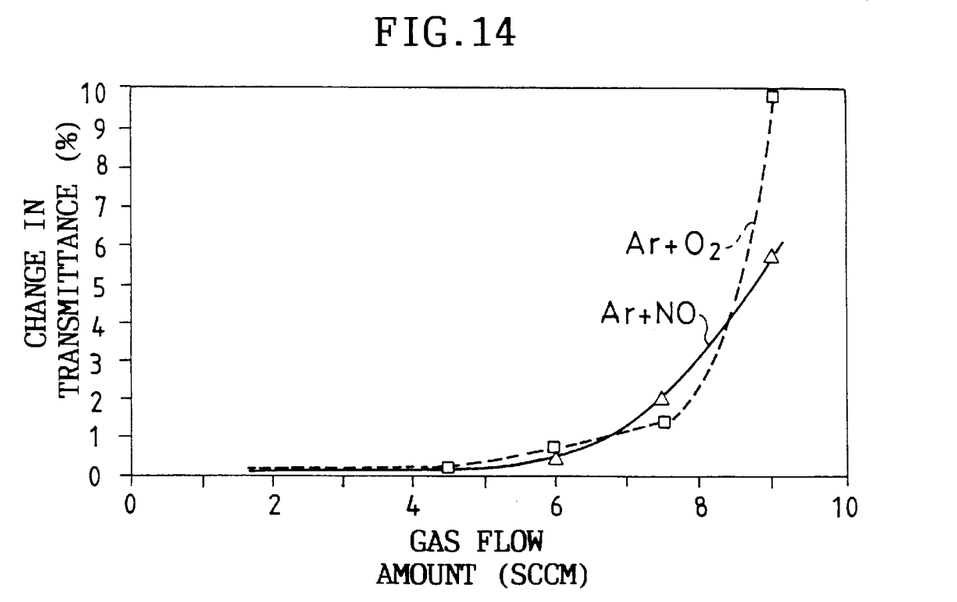
FIG. 14 is a graph showing the resistance, to a mixture of a concentrated sulfuric acid and hydrogen peroxide, of a phase-shifting photomask manufactured by the method of the present invention as represented in the change in transmittance at a KrF excimer laser wavelength.
Figure 15:
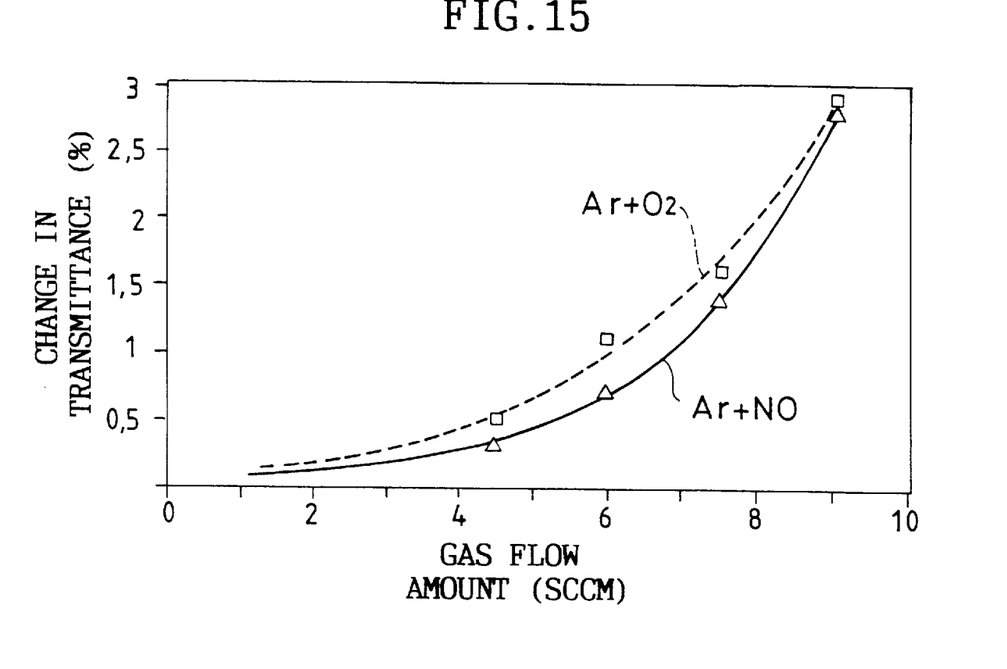
FIG. 15 is a graph showing the resistance, to a mixture of a concentrated sulfuric acid and hydrogen peroxide, of a phase-shifting photomask manufactured by the method of the present invention as represented in the change in transmittance at an i-line wavelength.
Figure 16:
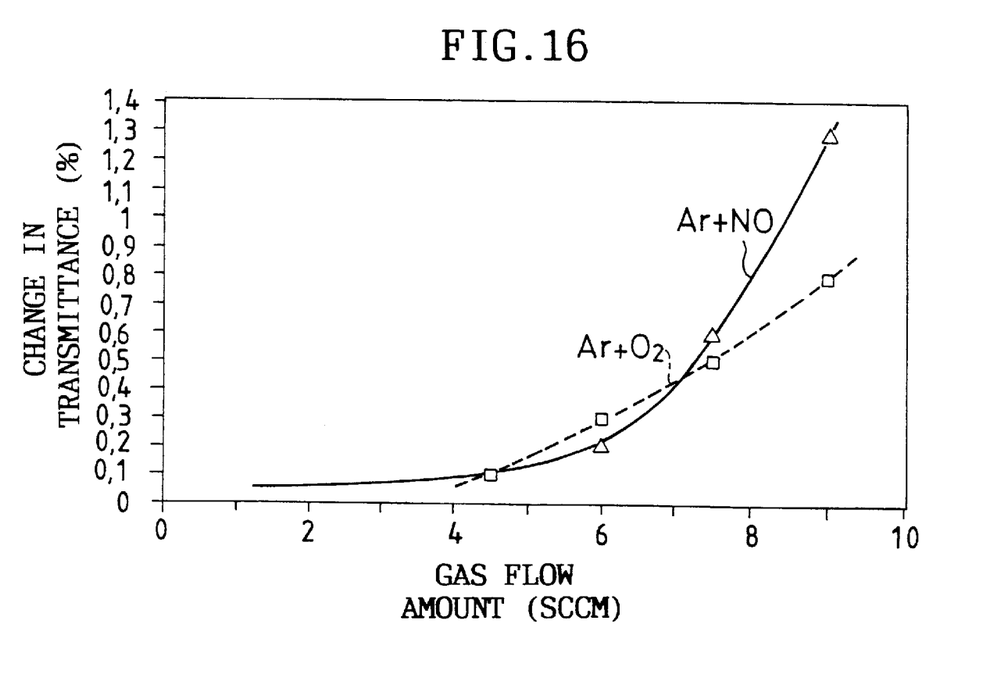
FIG. 16 is a graph showing the resistance, to a mixture of a concentrated sulfuric acid and hydrogen peroxide, of a phase-shifting photomask manufactured by the method of the present invention as represented in the change in transmittance at a KrF excimer laser wavelength.

FIGS. 9 and 10 show the results of experiments in which the samples were immersed into an aqueous solution of ammonia ($NH_3$:0.5% by weight) for 1 hour at room temperature. FIGS. 11 and 12 show the results of experiments in which the samples were immersed into concentrated sulfuric acid ($H_2SO_4$:96% by weight) for 0.5 hour at 100° C. FIGS. 13 and 14 show the results of experiments in which the samples were immersed into a mixed solution containing 4:1% by volume of concentrated sulfuric acid of the same concentration as the above-described concentrated sulfuric acid and hydrogen peroxide ($H_2O_2$:30% by weight) for 0.5 hour at 100° C. FIGS. 15 and 16 show the results of experiments in which the samples were immersed into a mixed solution containing 9:1% by volume of concentrated sulfuric acid of the same concentration as the above-described concentrated sulfuric acid and nitric acid ($HNO_3$:60% by weight) for 0.5 hour at 100° C.

The abscissas of FIGS. 9–16 represent the flow rate (SCCM) of nitric monoxide or oxygen contained in 170 SCCM of sputtering gas. The ordinates thereof represent the amount of change in transmittance T (%). The changes in transmittance at a wavelength of 365 nm of i-line are shown in FIGS. 9, 11, 13 and 15. The changes in transmittance at a wavelength of 248 nm of KrF excimer laser are shown in FIGS. 10, 12, 14 and 16.

As can be seen from FIGS. 9–16 and Table 5, except for the experiments in which the samples were immersed into the aqueous solution of ammonia, the nitrided-oxide films of molybdenum silicide formed by using the sputtering gas to which nitric monoxide was added are superior in chemical durability to the nitrided-oxide films of molybdenum silicide formed by using the sputtering gas to which only oxygen was added. Particularly, it can be seen that those with a smaller amount of addition of nitric monoxide are superior in chemical durability.

The transmittance in the wavelength of KrF excimer laser can be used, as can be seen from Tables 1, 2 and 4, for the phase-shifting photomask when, in a total flow amount of 170 SCCM of sputtering gas, nitric monoxide is contained in about 4.5–11 SCCM (about 2.65–about 6.47% in terms of content of nitric monoxide).

Further, the samples on which films were formed under the conditions of M-5, M-15, M-8, M-18, M2-2 and M2-3 were immersed into concentrated sulfuric acid of the same concentration as the above-described concentrated sulfuric acid for 1 hour at 100° C. Thereafter, the changes in the transmittance at wavelengths of 248 nm and 488 nm were measured. The results of the measurements are given in Table 5.

Figure 17:
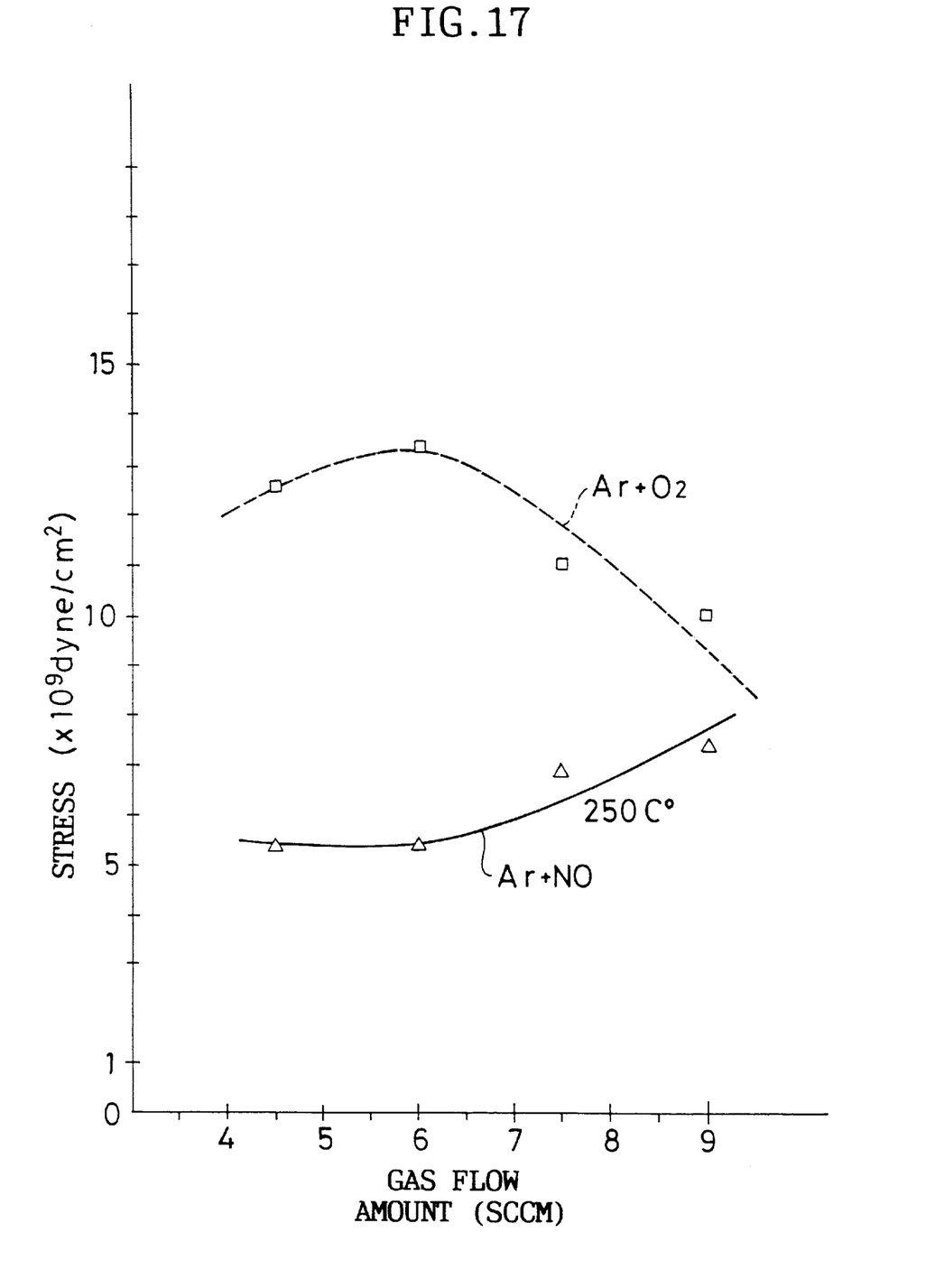
FIG. 17 is a graph showing an internal stress of a phase-shifting photomask manufactured by the method of the present invention.

The relationship between the amount of addition of nitric monoxide and a stress in a film is shown in FIG. 17. The ordinate represents the stress in the film and the abscissa represents the amount (SCCM) of nitric monoxide contained in 170 SCCM of sputtering gas which is made up of argon and nitric monoxide. As a comparative example, there is given a stress in an oxide film of molybdenum silicide formed with a sputtering gas obtained by adding oxygen to argon. It can be seen that the stress in the nitrided-oxide film of molybdenum silicide formed by the method of the present invention is smaller and is therefore superior.

Figure 19:
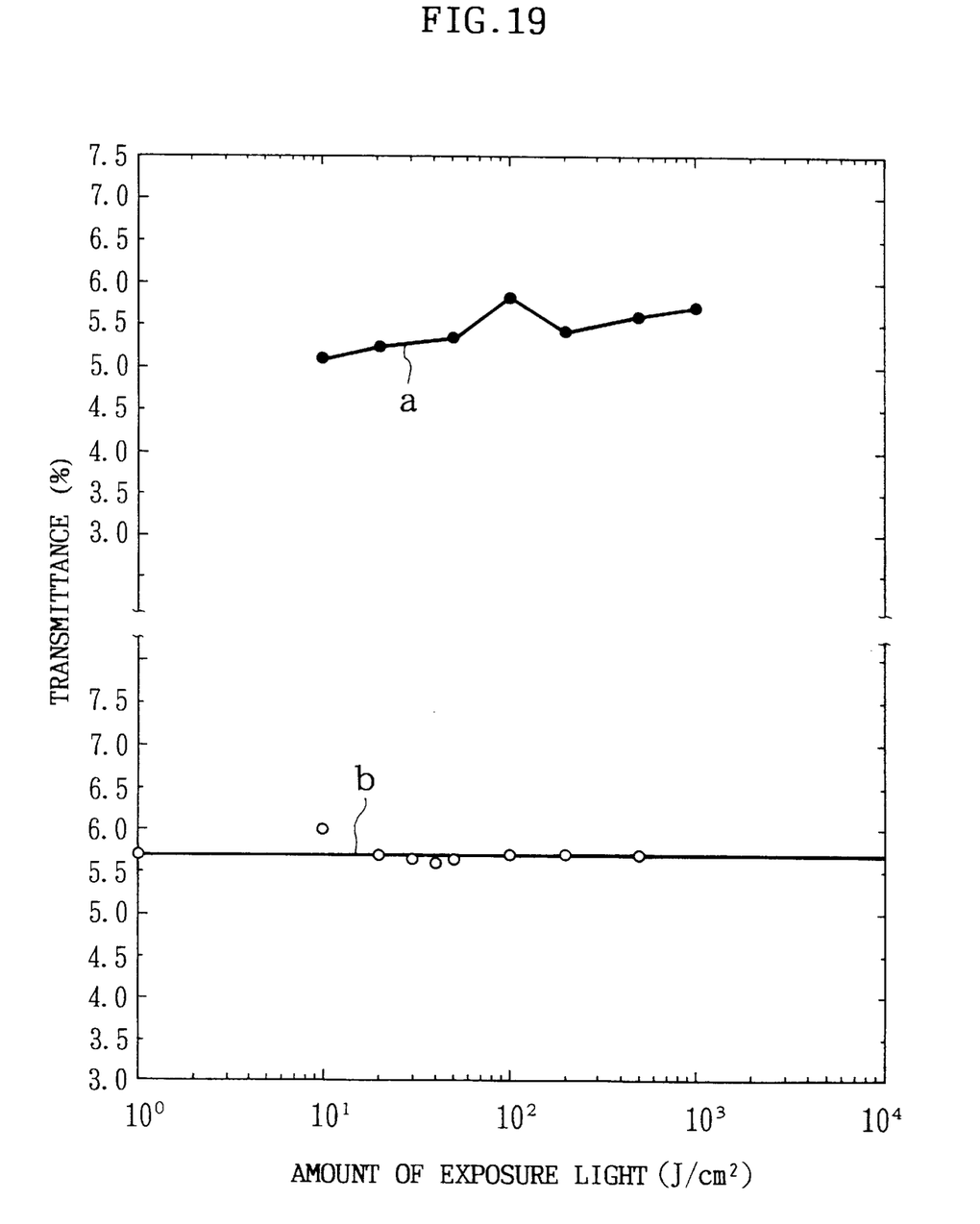
FIG. 19 is a graph showing the relationship between the amount of exposure light and the transmittance of a phase-shifting photomask blank manufactured by the method of the present invention.
Figure 20:
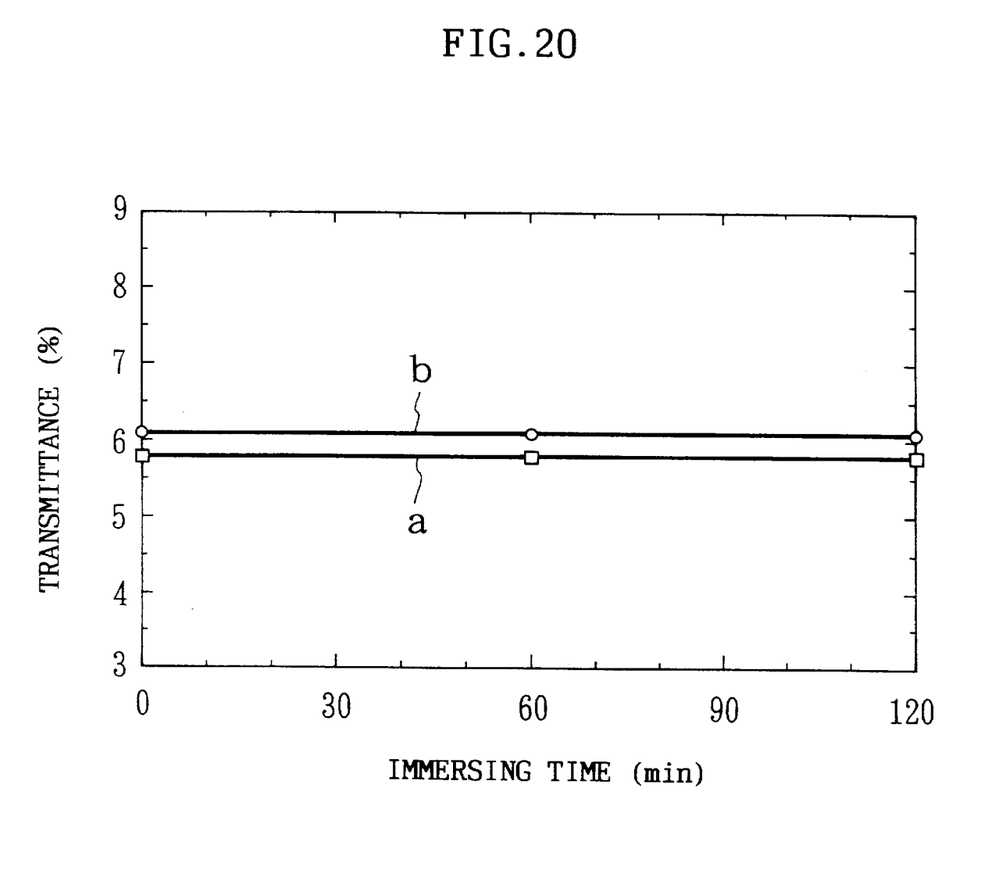
FIG. 20 is a graph showing the chemical durability to concentrated sulfuric acid and aqueous solution of ammonia of a two-layer construction of phase-shifting photomask blank manufactured by the method of the present invention, represented as a change in transmittance of KrF excimer laser wavelength relative to an immersing time.

Further, regarding the two-layer construction, there is shown in FIG. 19 the relationship between amount of exposure light and the transmittance due to the difference in the heat treatment conditions. The results of chemical durability are shown in FIG. 20. In FIG. 19, the ordinate represents the transmittance (%) at the exposure lightwave and the abscissa represents the amount of exposure light (energy: $J/cm^2$). Test samples were made in substantially the same conditions as those of the above-described samples. Namely, a first layer as a basic layer was formed on a quartz substrate in the same conditions as in M-7. On top of this first layer there was formed a second layer as a surface layer (or a top coat) in the same conditions as in M-5. Thereafter, they were subjected to heat treatment for 1 hour at 250° C. (curve (a) in the figure) and for 3 hours at 350° C. (curve (b) in the figure) in the air. The transmittance at KrF excimer laser wavelength of the nitrided-oxide film of molybdenum silicide thus obtained was measured. As can be clearly seen in FIG. 19, the transmittance of the sample that was subjected to heat treatment at 350° C. shows little or no change with the increase in the amount of exposure light. In FIG. 20, the ordinate represents the transmittance (%) at the exposure lightwave and the ordinate represents the time (min.) of immersing. The test samples were of two-layer construction as used in the testing of FIG. 19. The heat treatment conditions were 3 hours at 350° C. The nitrided-oxide films thus obtained were immersed into concentrated sulfuric acid of the same concentration as that in the case of FIGS. 11 and 12 for 2 hours at 100° C. (curve (a) in the figure), or were immersed into an aqueous solution of ammonia of the same concentration as that in the case of FIGS. 9 and 10 for 2 hours at room temperature (curve (b) in the figure). Thereafter, the transmittance of the films at KrF laser wavelength was measured. It can be seen that they are superior in chemical durability.

As has been explained so far, the nitrided-oxide films of molybdenum silicide formed with the sputtering gas obtained by adding nitric monoxide to argon in a ratio of 2.65–6.47% by volume (M-6–M-10 and M-16–M-20) fall within a range of about 3–40% in transmittance at the wavelength (248 nm) of KrF excimer laser as shown in Table 2. In addition, the transmittance at the inspection wavelength (488 nm) also falls within a range below about 50% which can be used for defect inspection. It can therefore be seen that a phase-shifting film can be constituted only by a single layer of the nitrided-oxide film of molybdenum silicide formed under these conditions.

By the way, as shown in Table 2, the nitrided-oxide films of molybdenum silicide formed with the sputtering gas obtained by adding nitric monoxide to argon in a ratio of 0.59% by volume and over but below 2.65% by volume (M-1–M-5 and M-11–M-15) are low in transmittance at the wavelength (248 nm) of KrF excimer laser. Therefore, it is not always suitable to constituting a phase-shifting film by a single-layer film.

However, as has been explained hereinabove, the nitrided-oxide films of molybdenum silicide formed in the conditions of a low content of nitric monoxide are superior in chemical durability and are also small in internal stresses. Therefore, the following arrangement is possible. Namely, a film formed by the conventional methods (i.e., a thin film of a metallic oxide, a metallic nitride, a metallic nitrided-oxide, a metallic carbide, and a metal, such as an oxide film of molybdenum silicide, a nitrided-oxide film of molybdenum silicide, an oxychromium film, a nitrided-oxide chromium film or the like; not limited to a single-layer film) or a phase-shifting film formed by the sputtering conditions of high concentration of nitric monoxide according to the present invention is used as a first-layer film which serves as a base-layer film. The nitrided-oxide film of molybdenum silicide which is formed with a sputtering gas obtained by adding nitric monoxide in a ratio of 0.59% by volume and over but below 2.65% by volume is used as a second-layer film which serves as a surface layer. Then, the chemical durability can be further improved by the second-layer film in the form of nitrided-oxide film of molybdenum silicide. It follows that as the surface layer the nitrided-oxide film of molybdenum silicide formed with a sputtering gas obtained by adding nitric monoxide in a ratio of 0.59–6.47% by volume can be used.

Figure 2:
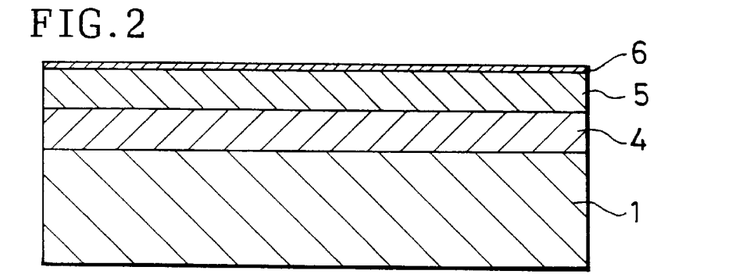
FIG. 2 is a schematic diagram showing part of the processes of one example of the method according to the present invention.

Phase-shifting photomask blanks were thus manufactured under the above-described respective conditions. Among the blanks, those which were not subjected to testing of chemical durability were subjected to the following further processing. Namely, as shown in FIG. 2, an electron beam resist (e.g., "ZEP-810S" (a registered trademark) manufactured by Nippon Zeon Co., Ltd.) was coated on each nitrided-oxide film of molybdenum silicide 4 formed on the quartz substrate 1 to thereby form a resist film 5 to a thickness of 5000 Å. Then, since the nitrided-oxide film of molybdenum silicide does not have conduction and is electrostatically charged if exposed by an electron beam, an antistatic film 6 ("Espacer 100" (a registered trademark) manufactured by Showa Denko Co., Ltd.) was formed on the resist film 5 to a thickness of about 100 Å.

Figure 3:
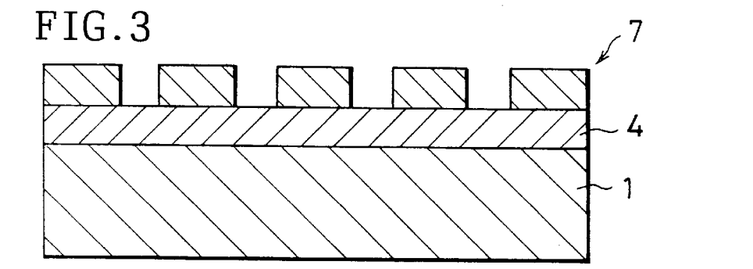
FIG. 3 is a schematic diagram showing part of the processes of one example of the method according to the present invention.

Thereafter, an electron beam exposure was performed and, as shown in FIG. 3, the antistatic film 6 was removed by washing with water and the resist film 5 was developed, thereby forming a resist pattern 7.

Figure 4:
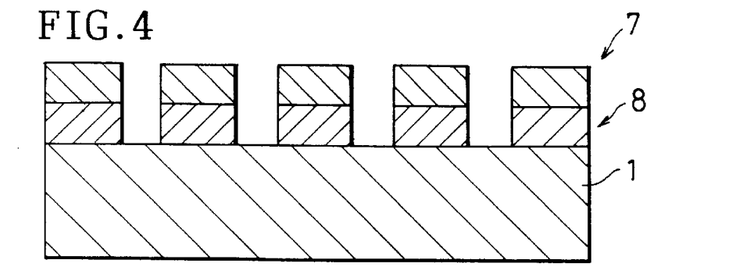
FIG. 4 is a schematic diagram showing part of the processes of one example of the method according to the present invention.
Figure 5:
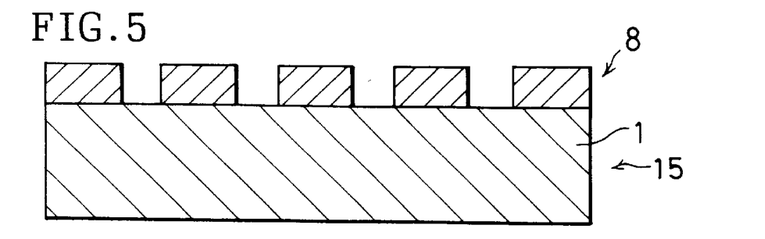
FIG. 5 is a schematic diagram showing part of the processes of one example of the method according to the present invention.

With this resist pattern 7 as a mask, the following steps were performed. Namely, in a parallel-plate type of RF ion etching apparatus, a mixture gas of $CF_4$ (flow rate: 100 SCCM) and $O_2$ (flow rate: 5 SCCM) was used as a reaction gas to perform a reaction for 3 minutes under conditions of a distance between the electrode and the substrate of 60 mm and an operating pressure of 0.4 Torr, thereby etching the phase-shifting film 4. A circuit pattern 8 to be transferred to a semiconductor substrate was formed on the quartz substrate 1 as shown in FIG. 4. Then, the resist pattern was removed to thereby form a phase-shifting photomask 15 as shown in FIG. 5.

As shown in FIG. 7, the samples in which the nitrided-oxide film of molybdenum silicide 2 was formed as the surface layer were also subjected to a similar processing to thereby manufacture a circuit pattern 8' on the quartz substrate 1 with the circuit patterns 2', 4'. The resist pattern was then removed to form the phase-shifting photomask 10.

After the phase-shifting photomasks were manufactured in the steps as described above, the optical properties of the phase-shifting photomasks at the KrF excimer laser wavelength and the inspection wavelength were measured using a spectrophotometer.

In the nitrided-oxide film of molybdenum silicide formed under the conditions of M-1–M-10, the transmittance of the phase-shifting film varied by about 0.5–1.0%. This is considered to be due to the heat treatment in the resist coating process or the like after having formed the phase-shifting film, as has been regarded to be the problem with the conventional art.

On the other hand, since the nitrided-oxide films of molybdenum silicide formed under the conditions of M-11–M-24 were subjected to heat treatment, the transmittance was found to have increased if the film thickness remained the same, resulting in stable optical properties.

In the present examples nitric monoxide was added to argon to obtain the sputtering gas. However, it is not limited to argon. Instead of argon, inert gases such as neon, krypton, xenon or the like may also be used.

In the present examples there were used molybdenum silicide targets having a ratio of molybdenum (Mo) and silicon (Si) of about 1:2. When molybdenum silicide targets in which the ratio of silicon varied within a range of about ±10% were used, the properties of the nitrided-oxide films of molybdenum silicide did not vary.

In the above embodiments, explanations have been made by way of examples about the phase-shifting photomask blanks of a single-layer film construction and a two-layer film construction. The following arrangement may also be employed. Namely, on top of a phase-shifting film serving as a base layer consisting of two or more layers, another phase-shifting film serving as a surface layer may be formed with a sputtering gas of a low concentration of nitric monoxide. Or else, instead of a multi-layer film construction, a phase-shifting film may be formed with a sputtering gas which is so arranged that the content of nitric monoxide becomes gradually smaller towards the surface as seen in the direction of thickness of the film, whereby a phase-shifting film having a desired surface layer of smaller content of nitrogen and oxygen is formed.

The phase-shifting photomask blank of the present invention is used not only for the exposure by KrF excimer laser but can also be widely used for i-line exposure, g-line exposure or the like. In addition, in the present embodiments DC magnetron sputtering was used in forming the nitrided-oxide films of molybdenum silicide. However, similar effects have been found to be obtainable when the films are formed by RF magnetron sputtering.

According to the present invention, there can be constituted a phase-shifting photomask blank by a single layer of nitrided-oxide film of molybdenum silicide, the single layer being high in chemical durability and good in transmittance at the exposure wavelength and at the inspection wavelength. Therefore, the manufacturing process becomes simpler and the yield improves.

In addition, if a thin film according to the prior art or the nitrided-oxide film of molybdenum silicide according to the present invention is used as the phase-shifting film and, on top of this film, the nitrided-oxide film of molybdenum silicide according to the present invention is formed as the surface layer, the phase-shifting film can be protected. Therefore, there can be obtained a superior phase-shifting photomask blank which is high in chemical durability and small in process variations (fluctuations).

It is readily apparent that the above-described phase-shifting photomask blank, phase-shifting photomask, as well as the method of manufacturing the same meet all of the objects mentioned above and also has the advantage of wide commercial utility. It should be understood that the specific form of the invention hereinabove described is intended to be representative only, as certain modifications within the scope of these teachings will be apparent to those skilled in the art. Accordingly, reference should be made to the following claims in determining the full scope of the invention.

What is claimed is:

1. A method of manufacturing a phase-shifting photomask blank comprising the step of sputtering a target of molybdenum silicide with a sputtering gas to which nitric monoxide is added in an amount of 2.65–6.47% by volume onto a transparent substrate, thereby forming a nitrided-oxide film of molybdenum silicide as a phase-shifting film on the transparent substrate.

2. A method of manufacturing a phase-shifting photomask blank comprising the steps of:

forming a base phase-shifting film on a transparent substrate; and therafter sputtering a target of molybdenum silicide with a sputtering gas to which nitric monoxide is added in an amount of 0.59–6.47% by volume onto a surface of said base phase-shifting film, thereby forming a nitrided-oxide film of molybdenum silicide as a surface layer on top of said base phase-shifting film.

3. A method of manufacturing a phase-shifting photomask blank according to claim 1 or 2, further comprising the step of subjecting the transparent substrate and the nitrided-oxide film of molybdenum silicide to a heat treatment at a temperature of 200° C. or more.

4. A method of manufacturing a phase-shifting photomask blank according to claim 1 or 2, further comprising the step of subjecting the transparent substrate and the nitrided-oxide film of molybdenum silicide to a heat treatment at a temperature of 250–350° C.

* * * * *